(12) United States Patent
Noguchi et al.

(10) Patent No.: US 11,810,611 B2
(45) Date of Patent: Nov. 7, 2023

(54) METHOD AND SYSTEM FOR REFRESH OF MEMORY DEVICES

(71) Applicant: TAIWAN SEMICONDUCTOR MANUFACTURING CO., LTD., Hsinchu (TW)

(72) Inventors: Hiroki Noguchi, Hsinchu (TW); Yih Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/716,446

(22) Filed: Apr. 8, 2022

(65) Prior Publication Data

US 2022/0230676 A1 Jul. 21, 2022

Related U.S. Application Data

(63) Continuation of application No. 16/996,788, filed on Aug. 18, 2020, now Pat. No. 11,309,011.

(60) Provisional application No. 62/981,740, filed on Feb. 26, 2020.

(51) Int. Cl.
*G11C 11/406* (2006.01)
*G11C 11/4091* (2006.01)
*G11C 11/4076* (2006.01)

(52) U.S. Cl.
CPC ...... *G11C 11/40611* (2013.01); *G11C 11/4076* (2013.01); *G11C 11/4091* (2013.01); *G11C 11/40626* (2013.01)

(58) Field of Classification Search
CPC .......... G11C 11/40611; G11C 11/4076; G11C 11/40626; G11C 11/4091
See application file for complete search history.

(56) References Cited

U.S. PATENT DOCUMENTS

| 5,784,328 A | 7/1998 | Irrinki et al. |
| 9,342,443 B2 | 5/2016 | Walker et al. |
| 2003/0191888 A1 | 10/2003 | Klein |
| 2012/0287731 A1 | 11/2012 | Kim |

*Primary Examiner* — Ajay Ojha
(74) *Attorney, Agent, or Firm* — Maschoff Brennan

(57) ABSTRACT

A memory system is provided. The memory system includes a controller configured to refresh a memory array at a first temperature before a first refresh time that is acquired from a lookup table and corresponds to a time period for stored data in the memory array being lost at the first temperature. After the controller acquires a second refresh time from the lookup table, the controller resets a refresh time period to refresh the memory array before the second refresh time. The second refresh time corresponds to a time period for stored data in the memory array being lost at a second temperature different from the first temperature. The refresh time period corresponds to a time period after refreshing the memory array.

20 Claims, 7 Drawing Sheets

METHOD AND SYSTEM FOR REFRESH OF MEMORY DEVICES

CROSS-REFERENCE TO RELATED APPLICATION

The present application is a continuation of U.S. patent application Ser. No. 16/996,788, filed on Aug. 18, 2020, now U.S. Pat. No. 11,309,011, issued Apr. 19, 2022, which claims priority to U.S. Provisional Patent Application No. 62/981,740, filed on Feb. 26, 2020, which is incorporated by reference herein in its entirety.

BACKGROUND

A magnetoresistive random access memory (MRAM) can be rewritten at high speed compared to other nonvolatile memories. Thus, it is considered that the MRAM is applied to a working memory such as a main memory and a cache memory. When an magnetic tunnel junction (MTJ) element as a storage element of the MRAM is enabled to be accessed at high speed in order to apply the MRAM to a cache memory. It is likely that data retention characteristics deteriorate and data retention time becomes short under high temperature conditions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
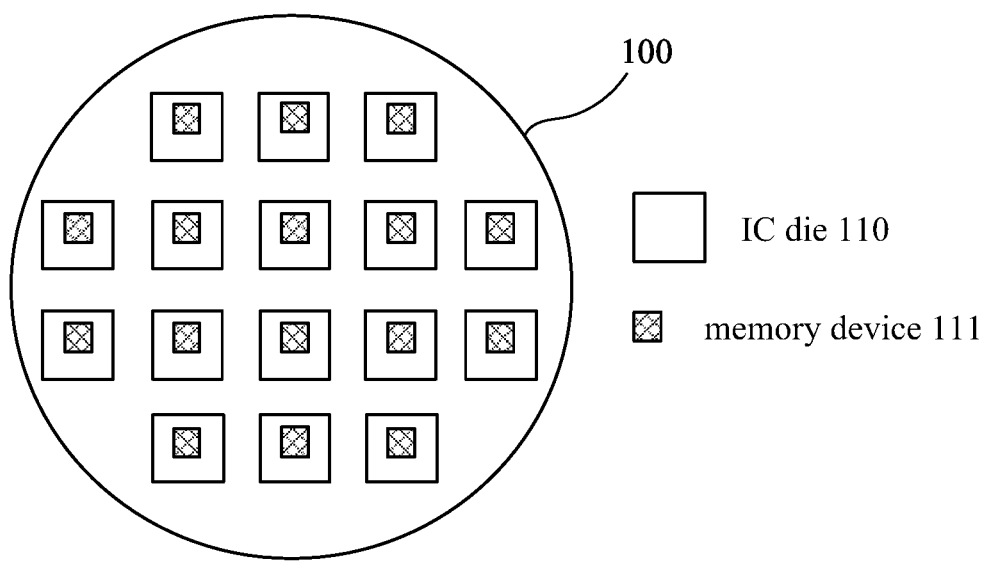
FIG. 1A is a schematic diagram of a wafer including multiple integrated circuits (chips/dies) in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1A. FIG. 1A is a schematic diagram of a wafer 100 including multiple integrated circuit chips/dies 110 in accordance with various embodiments of the present disclosure. As illustratively shown in FIG. 1A, the integrated circuit dies 110 include memory devices 111. In some embodiments, the memory devices 111 are implemented as data storage devices for writing and/or reading electronic data. In various embodiments, the data storage devices are implemented as volatile memory, such as random-access memory (RAM), which conventionally require power to maintain its stored information or non-volatile memory, such as read-only memory (ROM), which can maintain its stored information even when not powered. RAM can be implemented in a dynamic random-access memory (DRAM), a static random-access memory (SRAM), and/or a non-volatile random-access memory, often referred to as a flash memory, configuration. The electronic data can be written into and/or read from an array of memory cells which can be accessible through various control lines.

In some embodiments, magnetic random access memory (MRAM) and resistive random access memory (RRAM) are two types of recently developed memory devices. MRAM and RRAM are applicable for embedded memory, DRAM replacement, flash replacement, among other applications. MRAM and RRAM devices are inherently sensitive to process variations during device fabrication. Therefore, memory performance variations during testing are observed from die-to-die across the semiconductor wafer 100. Different dies at different wafer locations (e.g. center die vs. edge die) often have very different read/write windows, and fail the performance test of read/write window margin at a very high rate, which can limit the usefulness of the MRAM and the RRAM devices.

Figure 1B:
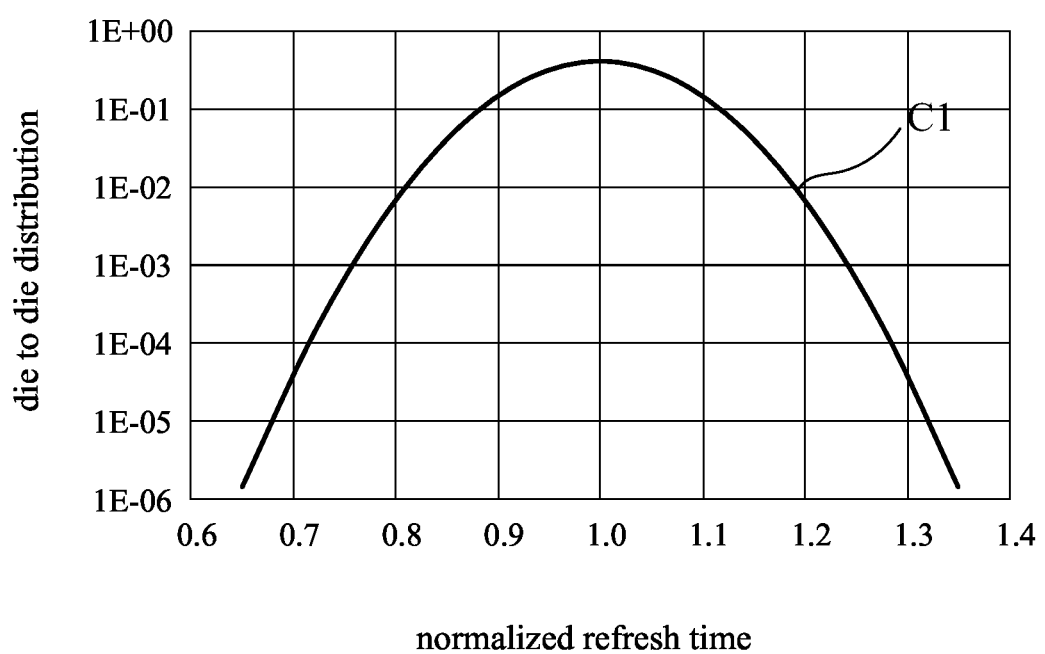
FIG. 1B is a schematic plot that shows die to die distribution versus their normalized refresh times in accordance with various embodiments of the present disclosure.

Reference is now made to FIG. 1B. FIG. 1B is a schematic plot including a curve C1 that shows die to die distribution versus their normalized refresh times in accordance with various embodiments of the present disclosure. The refresh time implies a moment when stored data in MRAM are loss or disappear. For illustration, the die to die distribution has a Gaussian distribution. In some embodiments, different MRAM cells/arrays on different dies may have different refresh times and different retention times for retaining data in the MRAM cells/arrays. To explain in another way, the data stored in the MRAM cells/arrays may loss or disappear after passing by the retention time or reaching the refresh time. Accordingly, a refresh operation is performed to the MRAM cells/arrays before the refresh time in order to retain stored data. However, as discussed above, there are large variations in retention times of different MRAM cells/arrays on different dies, and therefore, refresh operations with a uniform refresh cycle rate to all MRAM arrays on different dies are not effective (too frequent or infrequent for some dies), in some approaches.

On top of that, refresh operations negatively impact memory performance and power dissipation. First, a memory controller stalls normal read and write requests to the part of the memory that is being refreshed. Second, refresh operations consume energy because refreshing a memory row involves operations such as reading and restoring data. As the speed and size of memory devices continue to increase with each new technology generation, the performance and power overheads of refresh operations are increasing in significance.

In the present disclosure, a memory system and a method for automatically and digitally setting refresh cycle rates for memory arrays on different dies according to their refresh time-temperature characteristics are provided. In some embodiments, a memory controller included in the memory system acquires refresh time data of memory arrays on several memory devices (dies) based on operation temperatures sensed by temperature sensors on the memory devices. The refresh time data are stored in lookup tables in a storage unit. In some embodiments, the lookup tables are generated by counting refresh time periods of the memory arrays. On the basis of acquired refresh time data, the memory controller further sets refresh cycle rates of a refresh operation to be performed to the memory arrays. Accordingly, refresh cycle rates for the memory arrays on different memory devices are set separately and optimized based on temperature-dependent characteristics of individual memory devices.

Figure 2:
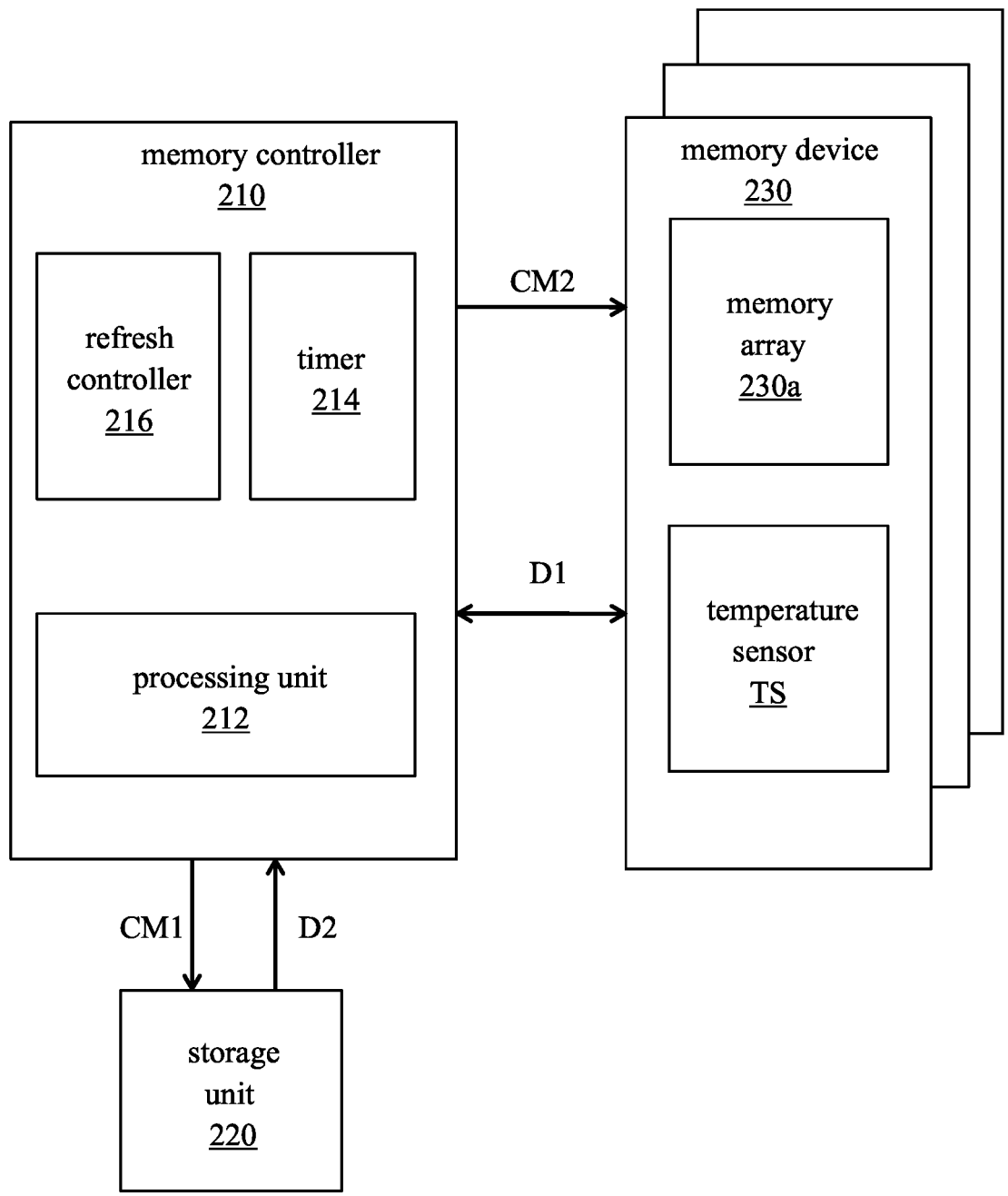
FIG. 2 is a schematic diagram of a memory system in accordance with other embodiments of the present disclosure.

Reference is now made to FIG. 2. FIG. 2 is a schematic diagram of a memory system 200 in accordance with other embodiments of the present disclosure. As illustratively shown in FIG. 2, the memory system 200 includes a memory controller 210, a storage unit 220, and at least one memory device 230. In some embodiments, the memory device 230 is configured with respect to the memory devices 111 in FIG. 1A, and is on one die of multiple dies in the memory system 200. For illustration, the memory device 230 is coupled to the memory controller 210. The memory controller 210 is further coupled to the storage unit 220.

For illustration, as shown in FIG. 2, the memory controller 210 includes a processing unit 212, a timer (scheduler) 214, and a refresh controller 216. The memory device 230 includes a memory array 230a and a temperature sensor TS. The details configurations and operations of the elements in the memory system 200 will be discussed with reference to FIGS. 3-6 in the following paragraphs.

In some embodiments, the memory controller 210 is implemented by one or more memory controller circuits or devices for memory system 200. The memory controller 210 is configured to generate memory access commands and access one or more memory devices 230 and the storage unit 220. In various embodiments, memory controller 210 includes I/O interface logic (not shown) to couple to a memory bus (not shown). The I/O interface logic includes pins, pads, connectors, signal lines, traces, or wires, or other hardware to connect the devices, or a combination of these. In various embodiments, the I/O interface logic includes a hardware interface or drivers, receivers, transceivers, or termination, or other circuitry or combinations of circuitry to exchange signals on the signal lines between the devices. The exchange of signals includes at least one of transmit or receive. While shown as coupling the memory controller 210 to the memory device 230, it will be understood that in an implementation of memory system 200 where groups of memory devices 230 are accessed in parallel, multiple memory devices are implemented by including I/O interfaces to the same interface of memory controller 210.

In some embodiments, the storage unit 220 is an electronic, magnetic, optical, electromagnetic, infrared, and/or a semiconductor system (or apparatus or device). For example, the storage unit 220 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the storage unit 220 includes a compact disk-read only memory (CD-ROM), a compact disk-read/write (CD-R/W), and/or a digital video disc (DVD).

In some embodiments, the memory device 230 is implemented by MRAM device in accordance with any referred to above. In various embodiments, the memory device 230 is configured to be as memory resource for memory system 200. In one embodiment, the multiple memory devices 230 are on separate memory dies. Each memory device 230 includes I/O interface logic (not shown), which has a bandwidth determined by the implementation of the device and enables each memory device 230 to interface with memory controller 210. In one embodiment, multiple memory devices 230 are connected in parallel to the same command and data buses. In another embodiment, multiple memory devices 230 are connected in parallel to the same command bus, and are connected to different data buses. For a write operation, an individual memory device 230 writes a portion of the overall data word, and for a read operation, an individual memory device 230 fetches a portion of the overall data word.

The configurations of FIG. 2 are given for illustrative purposes. Various implements are within the contemplated scope of the present disclosure. For example, in some embodiments, the memory controller 210 is included in a processor. In various embodiments, the memory controller 210 receives the instructions from a processor coupled thereto.

Figure 3:
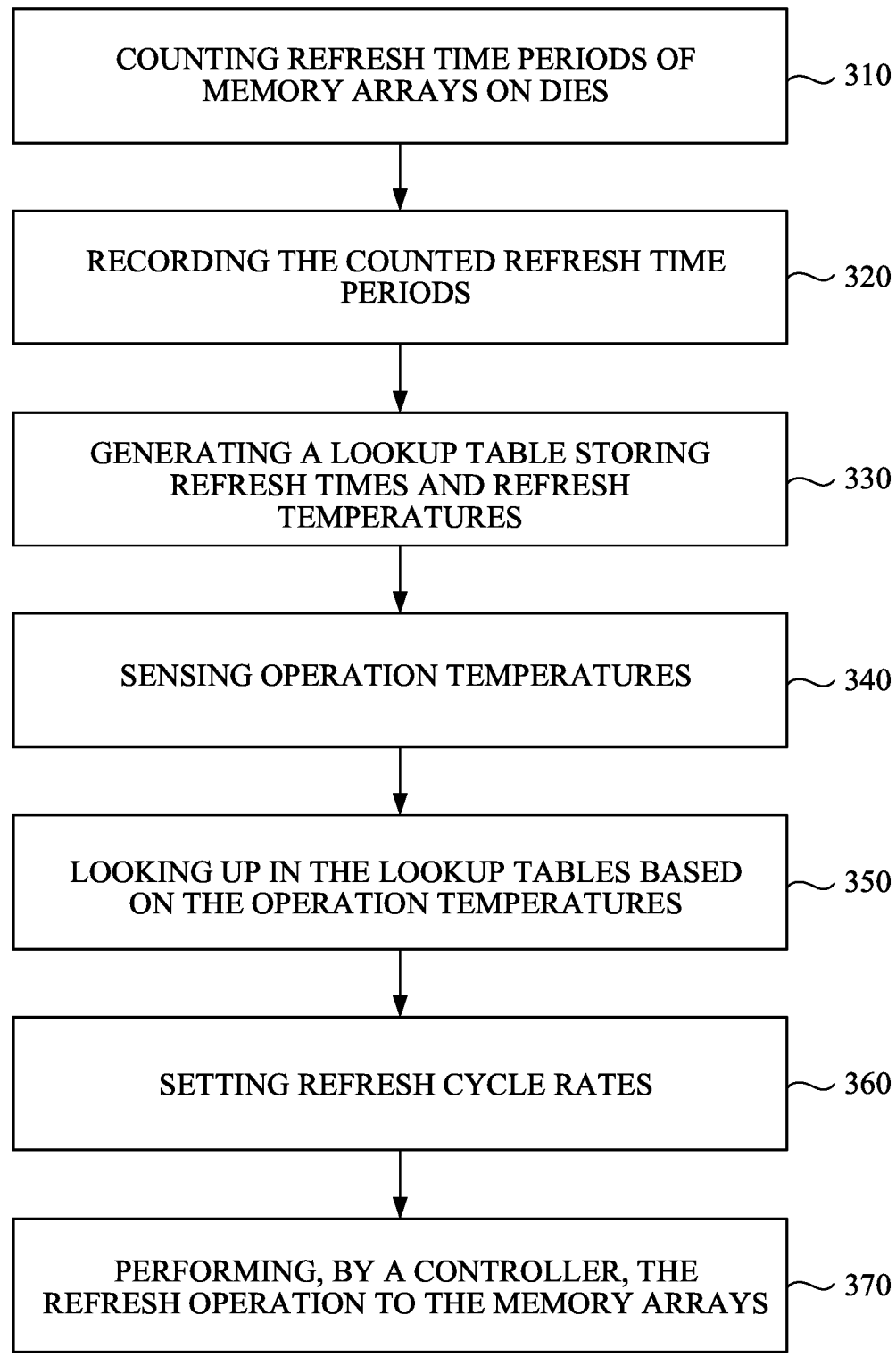
FIG. 3 is a flowchart of a method, in accordance with some embodiments of the present disclosure.

Reference is now made to FIG. 3. FIG. 3 is a flowchart of a method 300, in accordance with some embodiments of the present disclosure. It is understood that additional operations can be provided before, during, and after the processes shown by FIG. 3, and some of the operations described below can be replaced or eliminated, for additional embodiments of the method. The order of the operations/processes may be interchangeable. Throughout the various views and illustrative embodiments, like reference numbers are used to designate like elements. The method 300 includes operations 310-370 that are described below with reference to FIGS. 2 and 4.

In operation 310, refresh time periods of the memory arrays 230a on the memory devices (dies) 230 are counted by a testing system (not shown). In some embodiments, counting refresh time periods is performed by the timer 214 on each memory device 230 at different operation temperatures. For example, the temperature sensor TS on the memory device 230 is configured to sense the operation temperatures associated with the memory array 230a on the memory device 230. In some embodiments, the sensed operation temperatures are configured as refresh temperatures for the refresh operation to the memory arrays 230a.

In operation 320, the counted refresh time periods of the memory arrays 230a are recorded. For example, a timer in the testing system stops counting when the data stored in the memory arrays 230a are detected error or loss, and a processor unit in the testing system records the counted refresh time periods in a lookup table at different operation temperatures.

In operation 330, the lookup table storing the refresh time periods and the operation temperatures is generated and stored in the storage unit 220. In some embodiments, the lookup table is represented as shown below:

TABLE I exemplary lookup table of a memory array 230a on a memory device (die) 230

| refresh/operation temperature (° C.) | | | | | |
|---|---|---|---|---|---|
| −25 | 0 | 25 | 50 | 85 | 105 |
| refresh time >10 years | >10 years | 1.4 yrs | 2.6 days | 100 s | 1 s |

In some embodiments, multiple lookup tables are generated, and each lookup table corresponds to one of the memory devices (dies) 230. The lookup tables of different memory devices 230 are different from each other due to die-to-die variations of the memory devices 230. In various embodiments, the lookup tables are referred to as die-to-die variation tables.

In some embodiments, the memory devices 230 and the storage unit 220 are further disconnected from the testing system before shipping. Alternatively stated, the lookup tables of the memory devices 230 are generated/pre-static.

With continued reference to FIG. 3, in operation 340, the memory devices 230 are operating in the memory system 200 and the temperature sensor TS in each memory device 230 is configured to sense operation temperatures. For example, the temperature sensor TS senses the operation temperature of about 85° C. In some embodiments, multiple memory devices 230 are operating in similar temperature. In various embodiments, the memory devices 230 are operating in different temperatures which are sensed by the temperature sensors TS on each memory device 230.

In operation 350, the memory controller 210 looks up in the lookup tables based on the operation temperatures. For example, the memory controller 210 receives data signal D1 having the sensed operation temperature of 85° C., associated the memory array 230a on one memory device 230. The memory controller 210 looks up in the lookup table, based on the operation temperature of 85° C. through sending a control signal CM1 to the storage unit 220. In some embodiments, the processing unit 212 of the memory controller 210 executes instructions corresponding to the operation 350.

In some embodiments, the method 300 further includes that the memory controller 210 acquires a refresh time of about 100 s from the lookup table by receiving a data signal D2 from the storage unit 220. In some embodiments, the memory controller 210 looks up in the lookup tables associated with the memory arrays 230a on all memory devices 230 in the memory system 200, and acquires corresponding refresh times for all memory arrays 230a. In some embodiments, the processing unit 212 of the memory controller 210 executes instructions corresponding acquiring.

With continued reference to FIG. 3, in operation 360, the memory controller 210 sets refresh cycle rates for performing refresh operations to the memory arrays 230a on the memory devices 230. In some embodiments, the refresh cycle rates are determined as durations shorter than the corresponding refresh times. For example, with reference to the lookup table I above, the refresh time corresponding to the operation temperature of about 25° C. is about 1.4 years, and the refresh cycle rate is set as about 1.39 years. The refresh time corresponding to the operation temperature of about 50° C. is about 2.6 days, and the refresh cycle rate is set as about 2.5 days. The refresh time corresponding to the operation temperature of about 85° C. is about 100 seconds, and the refresh cycle rate is set as about 99 seconds. The refresh time corresponding to the operation temperature of about 105° C. is about 1 second, and the refresh cycle rate is set as about 0.9 seconds. Accordingly, the refresh operation will be performed to the memory array 230a before the stored data is getting lost.

In some embodiments, after setting the refresh cycle rate, the memory controller 210 initials the timer 214 to perform counting the refresh time period.

In operation 370, when the counted refresh time period meets the duration of the refresh cycle rate of about 99 s, the refresh controller 216 of the memory controller 210 performs the refresh operation to the memory array 230a. Alternatively stated, the memory controller 210 refreshes the stored data in the memory arrays 230a with the refresh cycle rate of about 99 s. In some embodiments, the memory controller 210 performs the refresh operation through a control signal CM2 sent to bit-lines or word lines in the memory arrays 230a.

Figure 4:
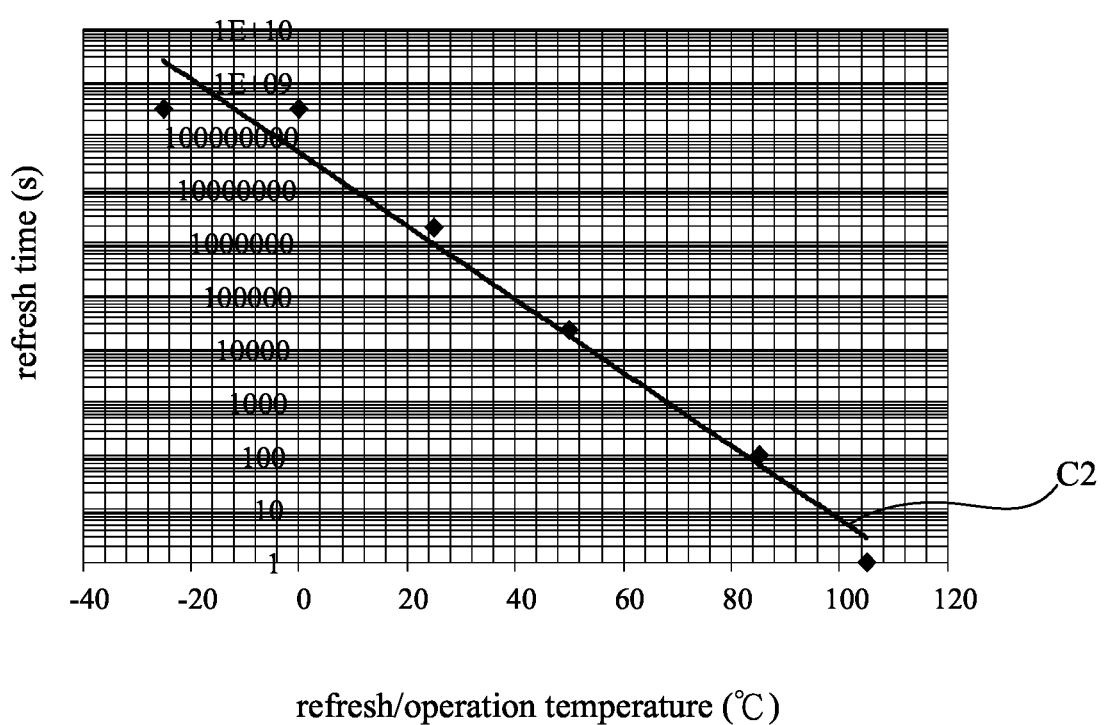
FIG. 4 is a schematic plot that shows refresh/operation temperature of the memory arrays versus their refresh times in accordance with various embodiments of the present disclosure.

In some embodiments, the method 300 further includes calculating, by the memory controller 210, the refresh cycle rates according to the die-to-die variation tables. As shown in FIG. 4, FIG. 4 is a schematic plot including a regression line C2 which shows refresh/operation temperature of the memory arrays versus their refresh times corresponding to the lookup table I in accordance with various embodiments of the present disclosure. For illustration, the regression line C2 is given and a regression equation is obtained correspondingly. Accordingly, a desired refresh time at certain operation temperature is calculated with regression equation, and a corresponding refresh cycle rate is determined.

For example, in the embodiments of FIG. 4 and the lookup table I, based on the regression equation corresponding to the regression line C2, a calculated refresh cycle rate corresponding to a given operation temperature of about 70° C. is about 12.5 minutes. In various embodiments, a calculated refresh cycle rate corresponding to a given operation temperature of about 40° C. is about 8.89 days.

The configurations of FIGS. 3-4 are given for illustrative purposes. Various implements are within the contemplated scope of the present disclosure. For example, in some embodiments, instead of setting the refresh cycle rates by the memory controller 210, the refresh cycles rates are determined and stored in the storage unit 220 after generating the lookup table. Alternatively stated, the operations 310-330 are performed before shipping the memory system 200, and the operation 360 is replaced by an operation of acquiring the pre-set refresh cycle rates from a lookup table including the refresh cycle rates, for example, a lookup table II shown as below:

TABLE II lookup table of the memory array 230a on the memory device (die) 230

| | refresh/operation temperature (° C.) | | | | | |
|---|---|---|---|---|---|---|
| | −25 | 0 | 25 | 50 | 85 | 105 |
| refresh time | >10 years | >10 years | 1.4 yrs | 2.6 days | 100 s | 1 s |
| refresh cycle rate | >10 years | >10 years | 1.39 yrs | 2.5 days | 99 s | 0.9 s |

Figure 5:
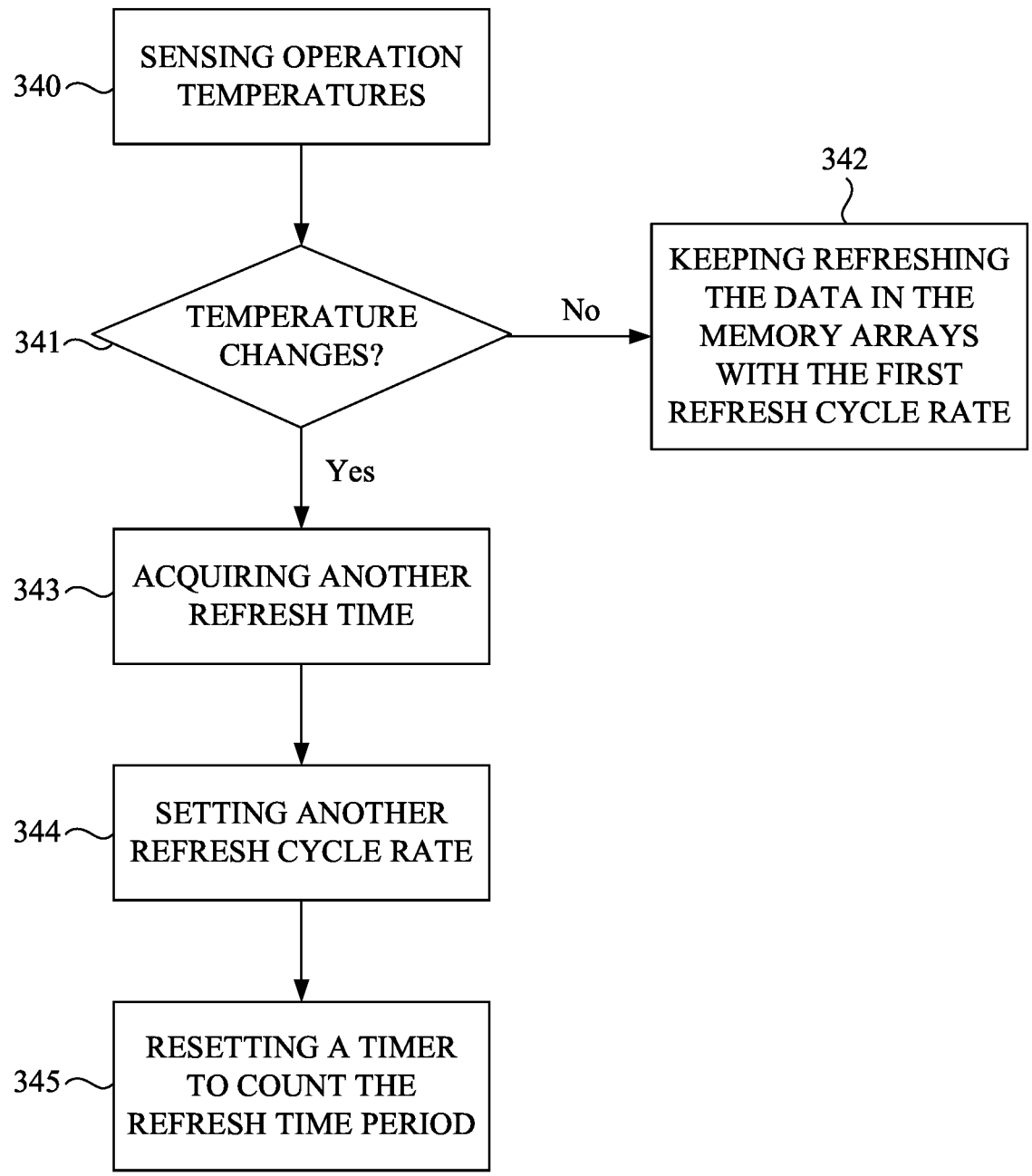
FIG. 5 is a flowchart showing detail operations corresponding to the method of FIG. 3, in accordance with some embodiments of the present disclosure.

In some embodiments, the method 300 further includes detail operations. Reference is now made to FIG. 5. FIG. 5 is a flowchart showing detail operations corresponding to the method 300 of FIG. 3, in accordance with some embodiments of the present disclosure. For illustration, the method 300 further includes operations 341-345 that are described below with reference to FIGS. 2 and 4.

With continued reference to the operation 340 of FIG. 3, after sensing the operation temperatures, the memory controller 210 further determines whether the operation temperatures change. In some embodiments, after determining that the operation temperatures do not change, the operation 342 is performed. In contrast, when the operation temperatures change, the operation 343 is performed.

In operation 342, because the operation temperatures remain unchanged, the memory controller 210 keeps utilizing the refresh controller 216 to refresh the data stored in the memory arrays 230a with the original refresh cycle rate. For example, when the operation temperature of the memory array 230a on one memory device 230 remains at about 50° C., the memory controller 210 keeps refreshing the memory arrays 230a by the original refresh cycle rate of about 2.5 days corresponding to the operation temperature of about 50° C. for several refresh cycles until the operation temperatures changes.

When the operation temperatures change, the operation 343 is performed. In operation 343, the memory controller 210 further acquires another refresh time corresponding to the changed operation temperature. For example, in some embodiments, when the operation temperature changes from about 50° C. to about 85° C., the memory controller 210 acquires the refresh time of about 100 seconds correspondingly.

In various embodiments, the method 300 further includes operation of determining whether the changed operation temperature is lower than the original operation temperature. When the changed operation temperature is lower than the original operation temperature, the timer 214 remains counting the current refresh time period until the refresh operation is performed. In some embodiments, after the refresh operation is performed, the memory controller 210 performed the operation 343 to acquire another refresh time corresponding changed operation temperature. Alternatively stated, the refresh cycle rate is set or determined based on the refresh time corresponding to the highest operation temperature detected in the current refresh interval.

After the operation 343, in operation 344, the memory controller 210 further sets another refresh cycle rate corresponding to the changed operation temperature. For example, as the embodiments discussed above, the memory controller 210 sets a new refresh cycle rate of about 99 s corresponding to the changed operation temperature of 85° C. Alternatively stated, when the operation temperature increases (i.e., from about 50° C. to about 85° C.), the duration of the refresh cycle rate decreases (i.e., from about 2.5 days to about 99 s). To explain in another way, when the operation temperature increases, the refresh cycle rate is faster than the original one. Similarly, in various embodiments, when the operation temperature decreases (i.e., from about 50° C. to about 25° C.), the duration of the refresh cycle rate increases (i.e., from about 2.5 days to about 1.39 years). To explain in another way, when the operation temperature decreases, the refresh cycle rate is slower than the original one.

With continued reference to FIG. 5, after performing the operation 344, the operation 345 is performed. In operation 345, the memory controller 210 reset the timer 214 to count the refresh time period. For example, in some embodiments, the operation temperature of the memory array 230a changes from about 50° C. to about 85° C. when the refresh time period counted by the timer 214 is 1.5 days. In response to the changed operation temperature, the timer 214 is reset to 0 and counts a new refresh time period at about 85° C.

In some embodiments, after the operation 345 is performed, the operation 370 of FIG. 3 is performed, and the operation 340 is performed continuously.

In some approaches, the refresh cycle rates for all memory arrays are the same at different operation temperatures. Furthermore, in order to prevent the stored data getting loss at higher temperatures, the refresh cycle rates are fixed in response to the higher temperatures. As a result, the refresh operation is performed too often when the memory device operates at lower temperatures, and impacts the performance and the power consumption of the memory device. In contrast, with the configurations of the present disclosure, the refresh cycle rates for memory arrays are adjusted automatically according to the operation temperatures. In addition, the memory arrays on various dies are refreshed based on die-dependent refresh time characteristics. Therefore, the performance and the power consumption of the memory device are improved.

In addition, memory devices included in the memory system experience various ambient temperatures. For example, an airflow in the memory system 200 in which the memory devices 230 are operating blows from the left of the memory system 200 to the right of the memory system 200. Based on the airflow direction in the memory system 200, the memory devices 230 at the left of the memory system 200 are cooler than the memory devices 230 at the right side of the memory system 200. With the configurations of FIG. 5, the memory devices 230 operating in different changed operation temperatures are refreshed by different refresh cycle rates. Accordingly, refresh operations for memory devices 230 are optimized.

The configurations of FIG. 5 are given for illustrative purposes. Various implements are within the contemplated scope of the present disclosure. For example, in some embodiments, when the operation temperature decreases by an insignificant amount, the memory controller 210 does not adjust the refresh cycle rate of the refresh operation.

Figure 6:
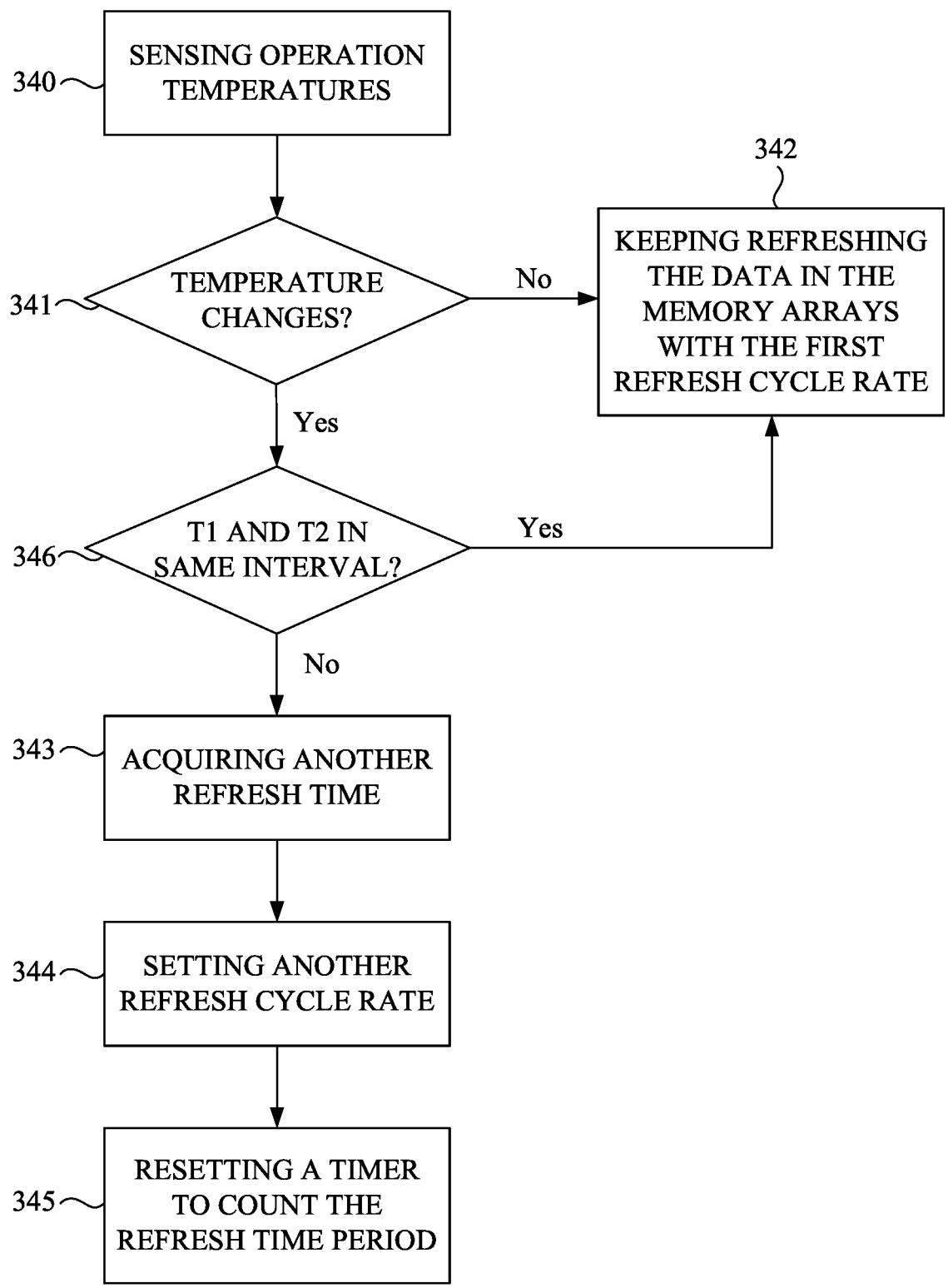
FIG. 6 is a flowchart showing detail operations corresponding to the method of FIG. 3, in accordance with some embodiments of the present disclosure.

In some embodiments, the method 300 further includes detail operations. Reference is now made to FIG. 6. FIG. 6 is a flowchart showing detail operations corresponding to the method 300 of FIG. 3, in accordance with some embodiments of the present disclosure. For illustration, compared with FIG. 5, the method 300 further includes operation 346 before the operation 343 that are described below with reference to FIGS. 2 and 4. With respect to the embodiments of FIGS. 3-5, like elements and operations in FIG. 6 are designated with the same reference numbers for ease of understanding.

For illustration, as shown in FIG. 6, after determining that the operation temperature changes, the operation 346 is performed. In operation 346, the memory controller 210 is further configured to determine whether an original temperature T1 and a changed temperature T2 are in the same temperature interval. When the temperatures T1-T2 are in the same temperature interval, the operation 342 is performed. When the temperatures T1-T2 are in different temperature intervals, the operation 343 is performed.

For example, in some embodiments, a lookup table III stored in the storage unit 220 is shown as below:

TABLE III lookup table of the memory array 230a on the memory device (die) 230

| | refresh/operation temperature (° C.) | | | | |
|---|---|---|---|---|---|
| | (−25)-0 | 1-25 | 26-50 | 51-85 | 86-105 |
| refresh time | >10 years | 1.4 yrs | 2.6 days | 100 s | 1 s |

For illustration, the lookup table III includes multiple refresh temperature intervals and corresponding refresh times. For operation temperatures in the refresh temperature interval of 1-25° C., the corresponding refresh time is determined to be about 1.4 yrs. For operation temperatures in the refresh temperature interval of 26-50° C., the corresponding refresh time is determined to be about 2.6 days. For operation temperatures in the refresh temperature interval of 51-85° C., the corresponding refresh time is determined to be about 100 seconds. For operation temperatures in the refresh temperature interval of 86-105° C., the corresponding refresh time is determined to be about 1 second.

As discussed above, in some embodiments, when the temperature T1 is about 38° C. and the temperature T2 is about 45° C., the memory controller 210 determines that the temperatures T1 and T2 are in the same temperature interval. Accordingly, the operation 342 is performed and the memory controller 210 keeps refreshing the data in the memory arrays 230a with the refresh cycle rate corresponding to about 38° C., for example, of about 2.5 days.

In various embodiments, when the temperature T1 is about 58° C. and the temperature T2 is about 45° C., the memory controller 210 determines that the temperatures T1 and T2 are in different temperature intervals. Accordingly, the operation 343 is performed. The memory controller 210 acquires another refresh time corresponding to 45° C., and sets the correspondingly refresh time cycle of about 2.5 days.

In addition, compared the lookup table III with the lookup table I, the lookup table III is generated by determining the refresh time of the highest temperature in the temperature interval as the refresh time of the temperature interval. For example, the refresh time of the temperature of 50° C. in the lookup table I is the refresh time of the temperature interval of 26 to 50° C. in the lookup table III. Accordingly, in some embodiments, the memory controller 210 is configured to monitor a highest operation temperature of sensed operation temperatures and to set the refresh cycle rate corresponding to the highest operation temperature.

The configurations of FIG. 6 are given for illustrative purposes. Various implements are within the contemplated scope of the present disclosure. For example, in some embodiments, ranges of the temperature intervals are different from that of the lookup table III.

Figure 7:
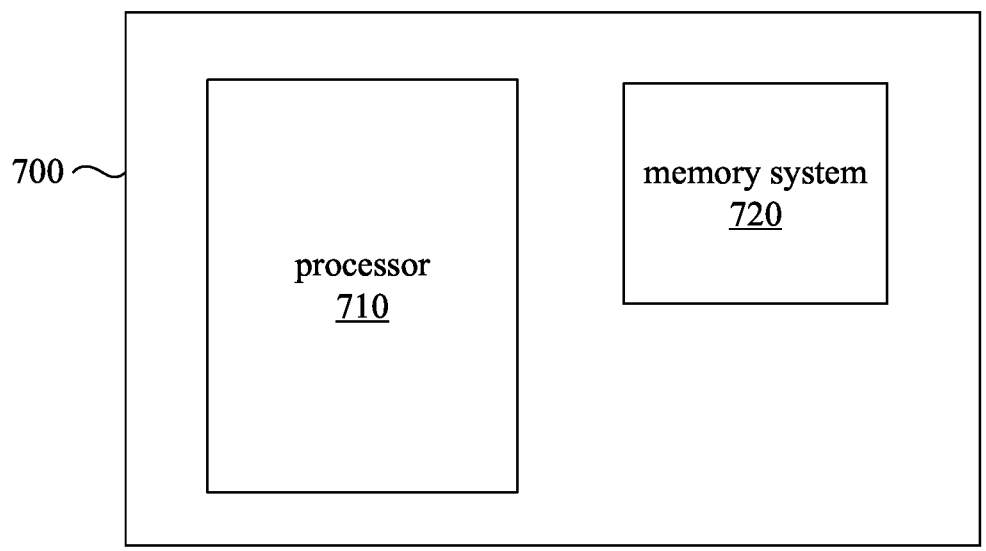
FIG. 7 is a schematic diagram of a computer system in accordance with various embodiments of the present disclosure.

Reference is now made to FIG. 7. FIG. 7 is a schematic diagram of a computer system 700 in accordance with various embodiments of the present disclosure. The computer system 700 includes a processor 710 and a memory system 720 coupled to the processor 710. In some embodiments, the memory system 720 is configured with respect to, for example, the memory system 200 of FIG. 2.

The processor 710 is capable of accessing the data stored in the memory cell of the memory system 720. In some embodiments, the processor 710 is a processing unit, central processing unit, digital signal processor, or other processor that is suitable for accessing data of the memory system 720. In some embodiments, the processor 710 transmits instructions for performing, for example, the method 300 of FIGS. 3, and 5-6, through the memory controller 210.

In some embodiments, the processor 710 and the memory system 720 are formed within a system that can be physically and electrically coupled with a printed wiring board or printed circuit board (PCB) to form an electronic assembly. The electronic assembly can be part of an electronic system such as a computer, wireless communication device, computer-related peripheral, entertainment device, or the like.

In some embodiments, the computer system 700 including the memory system 720 provides an entire system in one integrated circuit (IC), so-called system on a chip (SOC) or system on integrated circuit (SOIC) devices. These SOC devices may provide, for example, all of the circuitry needed to implement a cell phone, personal data assistant (PDA), cell phones, digital camcorder, digital camera, MP3 player, or the like in a single integrated circuit.

As described above, a memory system of the present disclosure utilizes refresh time data stored in lookup tables of memory devices to determine refresh cycle times for performing a refresh operation to memory arrays on the memory devices. Accordingly, optimized retention errors reduce error rates of the memory arrays, refresh energy for performing refresh operation is saved, and refresh overheads can be minimized.

A memory system is provided. The memory system includes a controller configured to refresh a memory array at a first temperature before a first refresh time that is acquired from a lookup table and corresponds to a time period for stored data in the memory array being lost at the first temperature. After the controller acquires a second refresh time from the lookup table, the controller resets a refresh time period to refresh the memory array before the second refresh time. The second refresh time corresponds to a time period for stored data in the memory array being lost at a second temperature different from the first temperature. The refresh time period corresponds to a time period after refreshing the memory array. In some embodiments, the controller includes a timer circuit configured to count the refresh time period. When an operation temperature of the memory array changes from the second temperature to a third temperature below the second temperature, the timer circuit keeps counting the refresh time period. In some embodiments, when the operation temperature of the memory array changes from the second temperature to a fourth temperature higher than the second temperature, the controller determines whether the second and fourth temperatures are in the same refresh temperature interval, and resets the timer circuit when the second and fourth temperatures are in different refresh temperature intervals. In some embodiments, wherein when an operation temperature of the memory array changes from the second temperature to a third temperature, the controller determines whether the second and third temperatures are in the same refresh temperature interval, and acquires a third refresh time from the lookup table when the second and third temperatures are in different refresh temperature intervals. The third refresh time corresponds to a time period for stored data in the memory array being lost at the third temperature. In some embodiments, the controller refreshes the memory array at the third temperature before the third refresh time. In some embodiments, the memory system further includes a storage unit configured to store the lookup table which includes multiple refresh times including the first and second refresh times and multiple refresh temperature intervals corresponding to the refresh times including the first and second refresh times. In some embodiments, the memory system further includes a storage unit configured to store the lookup table which includes multiple refresh times including the first and second refresh times and multiple refresh temperature corresponding to the refresh times including the first and second refresh times. The controller monitors a highest operation temperature associated with the memory array, and configured to acquire, based on the monitored highest operation temperation, a shortest refresh time of the refresh times.

Also disclosed a method. The method includes the operations below: looking up, based on a first sensed operation temperature, a first die-to-die variation table to acquire a first refresh time corresponding to a first memory device and a second die-to-die variation table to acquire a second refresh time corresponding to a second memory device, wherein the first and second refresh times are different from each other; setting a first refresh cycle rate shorter than the first refresh time to refresh data stored in a first memory device and setting a second refresh cycle rate shorter than the second refresh time to refresh data stored in a second memory device; looking up, based on a second sensed operation temperature higher than the first sensed operation temperature, the first die-to-die variation table to acquire a third refresh time corresponding to the first memory device and the second die-to-die variation table to acquire a fourth refresh time corresponding to the second memory device; and setting a third refresh cycle rate shorter than the third refresh time to refresh data stored in the first memory device and setting a fourth refresh cycle rate shorter than the fourth refresh time to refresh data stored in the second memory device. In some embodiments, the method further includes operations as below: comparing a third sensed operation temperature with the first sensed operation temperature; and when the third sensed operation temperature is less than the first sensed operation temperature, keeping counting a refresh time period until performing a refresh operation to the first memory device. In some embodiments, the method further includes operations as below: determining whether a third sensed operation temperature and the first sensed operation temperature are in the same temperature interval; and in response to the determination, acquiring a fifth refresh time corresponding to the first memory device from the first die-to-die variation table or keep counting a refresh time period until performing a refresh operation to the first memory device. In some embodiments, the method further includes operations as below: when the first and third sensed operation temperatures are in different temperature intervals and the third sensed operation temperature is lower than the first sensed operation temperature, acquiring a fifth refresh time corresponding to the first memory device from the first die-to-die variation table after performing the refresh operation to the first memory device. In some embodiments, the method further includes operations as below: resetting a first timer to count a first refresh time period after acquiring the third refresh time corresponding to the first memory device; and resetting a second timer to count a second refresh time period after acquiring the fourth refresh time corresponding to the second memory device. In some embodiments, the method further includes operations as below: monitoring a highest sensed operation temperature; acquiring a shortest refresh time from the first die-to-die variation table; and setting a shortest refresh cycle rate to refresh data stored in the first memory device. In some embodiments, the method further includes operations as below: after refreshing data stored in the first memory device with the shortest refresh cycle rate, comparing a current sensed operation temperature with the highest sensed operation temperature; and when the current sensed operation temperature is smaller than the highest sensed operation temperature, acquiring a fifth refresh time corresponding to the first memory device from the first die-to-die variation table.

Also disclosed is a method that includes the operations below: sensing an operation temperature variation associated with a memory array on a die; adjusting, in response to the operation temperature variation, a refresh cycle rate that corresponds to a time period for refreshing the memory array, wherein the refresh cycle rate is derived from a refresh time in a lookup table, wherein the refresh time is longer than the refresh cycle rate and corresponds to a time period for stored data in the memory array being lost at an operation temperature; and refreshing data stored in the memory array with an adjusted refresh cycle rate. In some embodiments, when the sensed operation temperature variation indicates that an operation temperature increases, the method further includes: determining whether the operation temperature exceeds a highest temperature limit in a first temperature interval. When the operation temperature exceeds the highest temperature limit, adjusting the refresh cycle rate includes: increasing the refresh cycle rate to obtain the adjusted refresh cycle rate. In some embodiments, when the operation temperature is less than the highest temperature limit, the method further includes: keep counting a refresh time period before refreshing the data stored in the memory array. In some embodiments, when the sensed operation temperature variation indicates that an operation temperature decreases, the method further includes: determining whether the operation temperature is smaller than a lowest temperature limit in a first temperature interval. When the operation temperature is smaller than lowest temperature limit, adjusting the refresh cycle rate includes decreasing the refresh cycle rate to obtain the adjusted refresh cycle rate. In some embodiments, when the sensed operation temperature variation indicates that the operation temperature increases, the method further includes determining whether the operation temperature exceeds a highest temperature limit in a first temperature interval; and when the operation temperature exceeds the highest temperature limit in the first temperature interval, determining whether the operation temperature exceeds a highest temperature limit in a second temperature interval different from the first temperature interval. In some embodiments, when the operation temperature exceeds the highest temperature limit in the second temperature interval, adjusting the refresh cycle rate includes: increasing the refresh cycle rate to obtain the adjusted refresh cycle rate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory system, comprising:
   a controller configured to refresh a memory array at a first temperature before a first refresh time that is acquired from a lookup table and corresponds to a time period for stored data in the memory array being lost at the first temperature,
   wherein after the controller acquires a second refresh time from the lookup table, the controller is further configured to reset a refresh time period to refresh the memory array before the second refresh time, wherein the second refresh time corresponds to a time period for stored data in the memory array being lost at a second temperature different from the first temperature,
   wherein the refresh time period corresponds to a time period after refreshing the memory array, and
   when an operation temperature of the memory array changes from the second temperature to a third temperature, the controller is further configured to acquire a third refresh time from the lookup table when the second and third temperatures are in different refresh temperature intervals.

2. The memory system of claim 1, wherein the controller comprises:
   a timer circuit configured to count the refresh time period,
   wherein when an operation temperature of the memory array changes from the second temperature to the third temperature below the second temperature,
   the timer circuit keeps counting the refresh time period.

3. The memory system of claim 2, wherein when the operation temperature of the memory array changes from the second temperature to a fourth temperature higher than the second temperature,
   the controller is configured to determine whether the second and fourth temperatures are in the same refresh temperature interval, and to reset the timer circuit when the second and fourth temperatures are in different refresh temperature intervals.

4. The memory system of claim 1, wherein when an operation temperature of the memory array changes from the second temperature to the third temperature,
   the controller is further configured to determine whether the second and third temperatures are in the same refresh temperature interval,
   wherein the third refresh time corresponds to a time period for stored data in the memory array being lost at the third temperature.

5. The memory system of claim 4, wherein the controller is further configured to refresh the memory array at the third temperature before the third refresh time.

6. The memory system of claim 1, further comprising:
   a storage unit configured to store the lookup table which comprises a plurality of refresh times including the first and second refresh times and a plurality of refresh temperature intervals corresponding to the plurality of refresh times including the first and second refresh times.

7. The memory system of claim 1, further comprising:
   a storage unit configured to store the lookup table which comprises a plurality of refresh times including the first and second refresh times and a plurality of refresh temperature corresponding to the plurality of refresh times including the first and second refresh times,
   wherein the controller is further configured to monitor a highest operation temperature associated with the memory array, and configured to acquire, based on the monitored highest operation temperature, a shortest refresh time of the plurality of refresh times.

8. A method, comprising:
   looking up, based on a first sensed operation temperature, a first die-to-die variation table to acquire a first refresh time corresponding to a first memory device and a second die-to-die variation table to acquire a second refresh time corresponding to a second memory device, wherein the first and second refresh times are different from each other;
   setting a first refresh cycle rate shorter than the first refresh time to refresh data stored in the first memory device and setting a second refresh cycle rate shorter than the second refresh time to refresh data stored in the second memory device;
   looking up, based on a second sensed operation temperature higher than the first sensed operation temperature, the first die-to-die variation table to acquire a third refresh time corresponding to the first memory device and the second die-to-die variation table to acquire a fourth refresh time corresponding to the second memory device; and
   setting a third refresh cycle rate shorter than the third refresh time to refresh data stored in the first memory device and setting a fourth refresh cycle rate shorter than the fourth refresh time to refresh data stored in the second memory device.

9. The method of claim 8, further comprising:
   comparing a third sensed operation temperature with the first sensed operation temperature; and
   when the third sensed operation temperature is less than the first sensed operation temperature, keeping counting a refresh time period until performing a refresh operation to the first memory device.

10. The method of claim 8, further comprising:
    determining whether a third sensed operation temperature and the first sensed operation temperature are in the same temperature interval; and
    in response to the determination, acquiring a fifth refresh time corresponding to the first memory device from the first die-to-die variation table or keep counting a refresh time period until performing a refresh operation to the first memory device.

11. The method of claim 10, further comprising:
when the first and third sensed operation temperatures are in different temperature intervals and the third sensed operation temperature is lower than the first sensed operation temperature,
acquiring a fifth refresh time corresponding to the first memory device from the first die-to-die variation table after performing the refresh operation to the first memory device.

12. The method of claim 8, further comprising:
resetting a first timer to count a first refresh time period after acquiring the third refresh time corresponding to the first memory device; and
resetting a second timer to count a second refresh time period after acquiring the fourth refresh time corresponding to the second memory device.

13. The method of claim 8, further comprising:
monitoring a highest sensed operation temperature;
acquiring a shortest refresh time from the first die-to-die variation table; and
setting a shortest refresh cycle rate to refresh data stored in the first memory device.

14. The method of claim 13, further comprising:
after refreshing data stored in the first memory device with the shortest refresh cycle rate, comparing a current sensed operation temperature with the highest sensed operation temperature; and
when the current sensed operation temperature is smaller than the highest sensed operation temperature, acquiring a fifth refresh time corresponding to the first memory device from the first die-to-die variation table.

15. A method, comprising:
sensing an operation temperature variation associated with a memory array on a die;
adjusting, in response to the operation temperature variation, a refresh cycle rate that corresponds to a time period for refreshing the memory array, wherein the refresh cycle rate is derived from a refresh time in a lookup table, wherein the refresh time is longer than the refresh cycle rate and corresponds to a time period for stored data in the memory array being lost at an operation temperature;
refreshing data stored in the memory array with an adjusted refresh cycle rate; and
keep counting a refresh time period before refreshing the data stored in the memory array.

16. The method of claim 15, wherein when the sensed operation temperature variation indicates that an operation temperature increases, the method further comprises:
determining whether the operation temperature exceeds a highest temperature limit in a first temperature interval;
wherein when the operation temperature exceeds the highest temperature limit, adjusting the refresh cycle rate comprises:
increasing the refresh cycle rate to obtain the adjusted refresh cycle rate.

17. The method of claim 16, wherein keep counting the refresh time period before refreshing the data stored in the memory array comprises:
when the operation temperature is less than the highest temperature limit,
keep counting the refresh time period before refreshing the data stored in the memory array.

18. The method of claim 15, wherein when the sensed operation temperature variation indicates that an operation temperature decreases, the method further comprises:
determining whether the operation temperature is smaller than a lowest temperature limit in a first temperature interval;
wherein when the operation temperature is smaller than the lowest temperature limit, adjusting the refresh cycle rate comprises:
decreasing the refresh cycle rate to obtain the adjusted refresh cycle rate.

19. The method of claim 18, wherein when the sensed operation temperature variation indicates that the operation temperature increases, the method further comprises:
determining whether the operation temperature exceeds a highest temperature limit in a first temperature interval; and
when the operation temperature exceeds the highest temperature limit in the first temperature interval, determining whether the operation temperature exceeds a highest temperature limit in a second temperature interval different from the first temperature interval.

20. The method of claim 19, wherein when the operation temperature exceeds the highest temperature limit in the second temperature interval, adjusting the refresh cycle rate comprises:
increasing the refresh cycle rate to obtain the adjusted refresh cycle rate.

* * * * *